United States Patent
Best et al.

(10) Patent No.: US 7,562,686 B2
(45) Date of Patent: Jul. 21, 2009

(54) METHOD AND SYSTEM FOR 3D ALIGNMENT IN WAFER SCALE INTEGRATION

(75) Inventors: Keith Frank Best, Best (NL); Geoffrey Norman Phillipps, Luyksgestel (NL); Franciscus Godefridus Casper Bijnen, Valkenswaard (NL); Enno Van Den Brink, Eindhoven (NL); Henricus Wilhelmus Maria Van Buel, Eindhoven (NL); Joseph J. Consolini, Costa Mesa, CA (US); Peter Ten Berge, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 480 days.

(21) Appl. No.: 11/317,241

(22) Filed: Dec. 27, 2005

(65) Prior Publication Data
US 2006/0172507 A1 Aug. 3, 2006

Related U.S. Application Data

(63) Continuation-in-part of application No. 11/020,556, filed on Dec. 27, 2004, now Pat. No. 7,442,476.

(51) Int. Cl.
*H01L 21/30* (2006.01)
*H01L 21/46* (2006.01)
(52) U.S. Cl. ..................... 156/379; 156/351
(58) Field of Classification Search ........... 438/455, 438/107, 401; 156/379, 351
See application file for complete search history.

(56) References Cited

U.S. PATENT DOCUMENTS 5,026,166 A * 6/1991 van der Werf ............ 356/401
5,151,149 A * 9/1992 Swartz ..................... 156/379.8

(Continued)

FOREIGN PATENT DOCUMENTS

EP  1 130 626 A2  9/2001

(Continued)

OTHER PUBLICATIONS

Frank Niklaus et al, "A method to maintain wafer alignment precision during adhesive wafer bonding", Sensors and Actuators A, 107, pp. 273-278 (Nov. 2003), XP004469972.

(Continued)

*Primary Examiner*—Alexander G Ghyka
*Assistant Examiner*—Reema Patel
(74) *Attorney, Agent, or Firm*—Pillsbury Winthrop Shaw Pittman LLP

(57) ABSTRACT

A substrate bonding system has a first and a second substrate table for holding a first substrate and a second substrate, respectively, and a controller. The first substrate includes a first device having first contact pads and the second substrate a second device having second contact pads. The wafer bonding system is arranged to bond the first and second device in such a way that a circuit may be formed by the first and second device. The first and second substrate tables each include a position sensor arranged to measure an optical signal generated on an alignment marker of the first and second substrate, respectively. The first and second substrate tables include a first and second actuator respectively that is arranged to alter a position and orientation of the respective substrate table.

11 Claims, 7 Drawing Sheets

U.S. PATENT DOCUMENTS

| | | | |
|---|---|---|---|
| 5,273,553 A * | 12/1993 | Hoshi et al. | 29/25.01 |
| 5,529,238 A | 6/1996 | Feinberg et al. | |
| 6,214,692 B1 | 4/2001 | Thallner | |
| 6,297,876 B1 * | 10/2001 | Bornebroek | 355/67 |
| 6,335,791 B1 | 1/2002 | Miyatake | |
| 6,768,539 B2 | 7/2004 | Gui et al. | |
| 6,936,385 B2 * | 8/2005 | Lof et al. | 430/22 |
| 7,433,038 B2 * | 10/2008 | Bijnen et al. | 356/400 |
| 2002/0109825 A1 | 8/2002 | Gui et al. | |
| 2004/0095546 A1 * | 5/2004 | Lee et al. | 349/187 |
| 2005/0255666 A1 * | 11/2005 | Yang | 438/401 |

FOREIGN PATENT DOCUMENTS

| | | |
|---|---|---|
| JP | 05-160340 A | 6/1993 |
| JP | 2001-313383 A | 11/2001 |
| JP | 2002-118052 A | 4/2002 |
| JP | 2003-110208 | 4/2003 |
| WO | 94/28374 | 12/1994 |

OTHER PUBLICATIONS

Noritsugu Yamamoto et al., "100-nm-Scale Alignment using Laser Beam Diffraction Pattern Observation Techniques and Wafer Fusion for Realizing Three-Dimensional Photonic Crystal Structure", Japanese Journal of Applied Physics, vol. 37, No. 6A, pp. 3334-3338 (Jun. 1998), XP 002271588.

European Search Report issued in European Application No. 05 25 8052 dated Jan. 29, 2007.

* cited by examiner

METHOD AND SYSTEM FOR 3D ALIGNMENT IN WAFER SCALE INTEGRATION

1. CROSS-REFERENCE TO RELATED APPLICATIONS

This application is a continuation-in-part of U.S. application Ser. No. 11/020,556 filed 27 Dec. 2004 now U.S. Pat. No. 7,442,476, which is hereby incorporated in its entirety by reference.

2. FIELD

The present invention relates to a method for three dimensional alignment in wafer scale integration and a system for three dimensional alignment in wafer scale integration.

3. BACKGROUND

Wafer bonding is a technology used in micro-electronics fabrication, in which a first substrate carrying first devices on its surface is brought into contact with second devices on a surface of a second substrate for fabricating an electronic circuit. Typically, the contact is arranged in such a way that signals can be transported from at least one first device on the first substrate to at least one second device on the second substrate and vice versa. The signals to be transported between the first device and the second device may be either electronic, photonic, fluidic, gaseous, magnetic, or sonic, or may relate to any other conceivable type of signal. The reason for wafer bonding is a cost of reduction for production and/or packaging and also an overall tendency of product shrinkage.

An example where wafer bonding is useful in reducing costs is when Si-based first devices need to be combined with second devices based on another substrate material such as a III-V or II-VI semiconductor substrate. Manufacturing of both types of devices on a single substrate may be virtually impossible due to the incompatibility of the constituent materials.

Another example is an electronic circuit made out of a first and second substrate where for reason of complexity, devices need to be fabricated on separate wafers (even though both substrates may be based on a similar substrate type).

In cases where an electronic circuit or "chip" needs to combine two or more devices not manufactured on a single substrate, wafer bonding can provide a way to combine those devices into a single package with a desired (electronic) function. On each device, area are reserved for providing one or more contact pads. A contact pad is intended for providing a connection between one of the devices and a similar contact pad on the other of the devices. Typically, the location of (a) contact pad(s) within the device area is defined during the design of the device or the electronic circuit of which the device is a part. The contact pads on devices to be bonded must have a sufficient alignment and overlap (i.e., a coincidence in their respective lateral positions within the device area) that a functional contact between the first and second devices is achieved: i.e. the electronic circuit formed from the devices is actually functional.

Note that for circuits where signals other than electric signals need to be exchanged between the first and second devices, instead of contact pads contact openings (for channels guiding the signals) may be provided. In that case the bonding operation must take care of aligning the contact openings on first and second devices with respect to each other to have functional contact between the first and second devices.

Conventional wafer bonding machines may provide a wafer bonding capability but with a limited accuracy of about 100 micrometers. In order to compensate the limitation of the accuracy by overlap, it is desirable that the contacts of both first and second devices to each other be relatively oversized in comparison to the contact sizes obtainable by lithographic processing (typically 0.25 µm or less).

Consequently, it is not possible to bond wafers manufactured with current lithographic technology in an efficient manner, since the needed "slack" of the contact pads on both devices on both substrates to have an sufficient overlap which allows successful bonding (i.e., to obtain an electronic circuit that can function) consumes a lot of the available wafer estate.

Moreover, conventional wafer bonding machines provide an alignment of first and second substrates in a merely mechanical way without providing a reference to the product location: the mechanical alignment between substrates is assumed to coincide with the alignment for devices between substrates. However, such an approach is not cost-effective since the yield may be relatively low.

Nevertheless, for device structures of relatively low density and relatively large feature size, such trial and error method could provide a sufficient bonding quality. For modern device structures with higher density this method may no longer be usable.

4. SUMMARY

It is desirable to provide a system and a method for wafer bonding or substrate bonding with alignment accuracy of similar magnitude as contact sizes of micro-electronic devices.

Further it is desirable to provide a system and method for wafer bonding or substrate bonding that can align substrates based on product location.

According to an embodiment of the invention, there is provided a wafer bonding system, or substrate bonding system, including: a first substrate table for holding a first substrate with a first orientation, a second substrate table for holding a second substrate with a second orientation, and a controller, the first substrate table having a first table position relative to a second table position of the second substrate table; the first substrate having a front surface including at least one first target portion including a first device, the first device having first contact pads; the second substrate having a second front surface including at least one second target portion including a second device, the second device having second contact pads; the wafer bonding system being arranged to bond the first and second device in such a way that a circuit may be formed by the first and second device; the first substrate table including a first work space surface for holding the first substrate, at least a first position sensor being arranged for measuring at least a first optical signal generated on at least a first back surface alignment marker of the first substrate and a first actuator being arranged for altering the first table position and a first orientation of the first substrate table; the second substrate table including a second work space surface for holding the second substrate, at least a second position sensor being arranged to measure at least a second optical signal generated on at least a second back surface alignment mark of the second substrate and a second actuator being arranged to alter second table position and a second orientation of the second substrate table, wherein the controller is arranged to: receive at least a first and at least a second measured optical signal from the at least first and at least second position sensors respectively; determine from the received at least first and at least second measured optical signals the first orientation of the first substrate and the second orientation of the second substrate, determine the first orientation of the first substrate relative to the second orientation of the second substrate, and send a control signal to at least one of the first and second actuators for altering the first table position and first orientation of the first substrate table relative to the second table position and second orientation of the second substrate table in such a way that alignment and overlap of the first contact pads of the first device and the second contact pads of the second device are achieved.

According to another embodiment of the invention, there is provided a method for wafer bonding, or substrate bonding, including: holding a first substrate with a first orientation on a first substrate table, holding a second substrate with a second orientation on a second substrate table, the first substrate table having a first table position relative to a second table position of the second substrate table; the first substrate having a front surface including at least one first target portion including a first device and a back surface including at least a first back surface alignment marker, the first device having first contact pads the second substrate having a second front surface including at least one second target portion including a second device and a second back surface including at least a second back surface alignment marker, the second device having second contact pads; the method including bonding the first and second device in such a way that a circuit may be formed by the first and second device; wherein the method further includes receiving at least a first and at least a second measured optical signal generated on the at least first back surface alignment mark of the first substrate and the at least second back surface alignment mark of the second substrate respectively; determining from the measured at least first and at least second measured optical signals the first orientation of the first substrate and the second orientation of the second substrate, determining the first orientation of the first substrate relative to the second orientation of the second substrate, and altering the first table position and first orientation of the first substrate table relative to the second table position and second orientation of the second substrate table in such a way that alignment and overlap of the first contact pads of the first device and the second contact pads of the second device are achieved.

According to a further embodiment of the invention, there is provided a controller for a wafer bonding system, or substrate bonding, including: a first substrate table for holding a first substrate with a first orientation, a second substrate table for holding a second substrate with a second orientation, and a controller, the first substrate table having a first table position relative to a second table position of the second substrate table; the first substrate having a front surface including at least one first target portion including a first device, the first device having first contact pads, the second substrate having a second front surface including at least one second target portion including a second device, the second device having second contact pads; the wafer bonding system being arranged to bond the first and second device in such a way that a circuit may be formed by the first and second device; the first substrate table including a first work space surface for holding the first substrate, at least a first position sensor being arranged to measure at least a first optical signal generated on at least a first back surface alignment marker of the first substrate and a first actuator being arranged to alter the first table position and a first orientation of the first substrate table, the second substrate table including a second work space surface for holding the second substrate, at least a second position sensor being arranged to measure at least a second optical signal generated on at least a second back surface alignment mark of the second substrate and a second actuator being arranged to alter second table position and a second orientation of the second substrate table, wherein the controller is arranged to: receive at least a first and at least a second measured optical signal from the at least first and at least second position sensors respectively; determine from the received at least first and at least second measured optical signals the first orientation of the first substrate and the second orientation of the second substrate, determine the first orientation of the first substrate relative to the second orientation of the second substrate, and to send a control signal to at least one of the first and second actuators for altering the first table position and first orientation of the first substrate table relative to the second table position and second orientation of the second substrate table in such a way that alignment and overlap of the first contact pads of the first device and the second contact pads of the second device are achieved.

According to still another embodiment of the invention, there is provided a controller program product to be loaded by a controller for use in a wafer bonding system, or substrate bonding system, the wafer bonding system including: a first substrate table for holding a first substrate with a first orientation, a second substrate table for holding a second substrate with a second orientation, and a controller, the first substrate table having a first table position relative to a second table position of the second substrate table; the first substrate having a front surface including at least one first target portion including a first device, the first device having first contact pads, the second substrate having a second front surface including at least one second target portion including a second device; the wafer bonding system being arranged to bond the first and second device in such a way that a circuit may be formed by the first and second device, the second device having second contact pads; the first substrate table including a first work space surface for holding the first substrate, at least a first position sensor being arranged for measuring at least a first optical signal generated on at least a first back surface alignment marker of the first substrate and a first actuator being arranged for altering the first table position and a first orientation of the first substrate table, the second substrate table including a second work space surface for holding the second substrate, at least a second position sensor being arranged to measure at least a second optical signal generated on at least a second back surface alignment mark of the second substrate and a second actuator being arranged to alter second table position and a second orientation of the second substrate table, wherein the controller program product after being loaded allows the controller to carry out: receiving at least a first and at least a second measured optical signal from the at least first and at least second position sensors respectively; determining from the received at least first and at least second measured optical signals the first orientation of the first substrate and the second orientation of the second substrate, determining the first orientation of the first substrate relative to the second orientation of the second substrate, and sending a control signal to at least one of the first and second actuators for altering the first table position and first orientation of the first substrate table relative to the second table position and second orientation of the second substrate table in such a way that alignment and overlap of the first contact pads of the first device and the second contact pads of the second device are achieved.

According to yet a further embodiment of the present invention, there is provided an alignment feedback system for wafer bonding system, or substrate bonding system, for bonding a first substrate and a second substrate, the first device having first contact pads and the second device having second contact pads, the alignment feedback system including:

a laser source for generating a laser beam, a first beam splitter for splitting a first beam portion and a second beam portion from the laser beam, at least one first position sensor arranged for measuring at least one first optical signal generated on at least one first back surface alignment marker of the first substrate by the first beam portion of the laser beam, at least one second position sensor arranged for measuring at least one second optical signal generated on at least one second back surface alignment marker of the second substrate by the second beam portion of the laser beam, at least one actuator for altering a first table position and a first orientation of the first substrate and for altering a second table position and a second orientation of the second substrate, and a controller for controlling the at least one actuator, wherein the alignment feedback system further includes a first detector and a second detector, the first detector is arranged in an optical path of the first beam portion and the second detector is arranged in a second optical path of the second beam portion, the first detector being arranged to measure a first interferometry signal originated by the at least one first optical signal, the second detector being arranged to measure a second interferometry signal originated by the at least one second optical signal.

Moreover, according to an embodiment of the invention, there is provided an alignment feedback system as described above wherein the controller is arranged to: receive the first and second interferometry signals, determine from the received first and second interferometry signals a first orientation of the first substrate and a second orientation of the second substrate, determine the first orientation of the first substrate relative to the second orientation of the second substrate, and send a control signal to at least one of the first and second actuators for altering the first table position and first orientation of the first substrate table relative to the second table position and second orientation of the second substrate table in such a way that alignment and overlap of the first contact pads of the first device and the second contact pads of the second device are achieved.

The present invention also relates to an electronic circuit device manufactured using the wafer bonding system as described above.

Moreover, according to a further embodiment of the invention there is provided an arrangement of a first substrate and a second substrate, the first substrate having a first orientation and having a front surface including at least one first target portion including a first device, the first device having first contact pads; the second substrate having a second orientation and having a second front surface including at least one second target portion including a second device, the second device having second contact pads, the first and second substrate being aligned and in overlap in accordance with the method as described above.

In an embodiment of the invention, there is provided a controller program product to be loaded by a controller for use in a substrate bonding system, the substrate bonding system including a first substrate table configured to hold a first substrate with a first orientation, a second substrate table configured to hold a second substrate with a second orientation, wherein the first substrate has a front surface including a first target portion that includes a first device, the first device having first contact pads, wherein the second substrate has a second front surface including a second target portion that includes a second device, the second device having second contact pads; wherein the substrate bonding system is arranged to bond the first and second device in such a way that a circuit may formed by the first and second device; wherein the first substrate table includes a first work space surface configured to hold the first substrate, a first position sensor arranged to measure a first optical signal generated on a first back surface alignment marker of the first substrate and a first actuator arranged to alter first table position and the first orientation of the first substrate table, wherein the second substrate table includes a second work space surface configured to hold the second substrate, a second position sensor arranged to measure a second optical signal generated on a second back surface alignment mark of the second substrate and a second actuator arranged to alter second table position and the second orientation of the second substrate table, the controller program including machine executable instructions executable by the controller to perform the bonding of the first substrate and the second substrate according to a method including:

receiving a first and a second measured optical signal from the first and second position sensors respectively;

determining from the received first and second measured optical signals the first orientation of the first substrate and the second orientation of the second substrate, and sending a control signal to a first of the first and second actuators to alter the first table position and first orientation of the first substrate table relative to the second table position and second orientation of the second substrate table so that alignment and overlap of the first contact pads of the first device and the second contact pads of the second device are achieved.

According to another embodiment, the invention provides a substrate bonding system that includes:

an alignment system including one or more first optical systems, one or more second optical systems, the one or more second optical systems including a folding mirror optical system, a first substrate table, the first substrate table being arranged to move into and out of a space defined between the opposing optical systems, and a second substrate table, the second substrate table being arrange to move into and out of a space defined between the opposing optical systems.

In an embodiment, the invention provides a substrate bonding system that is absent opposing microscopes and opposing alignment sensors.

In the following description the term "wafer bonding" may be termed as "substrate bonding". It will be appreciated that the term "wafer bonding system" or "substrate bonding system" broadly refer to a system that is configured to bond wafers or substrates.

5. BRIEF DESCRIPTION OF THE DRAWINGS

Embodiments of the invention will now be described, by way of example only, with reference to the accompanying schematic drawings in which corresponding reference symbols indicate corresponding parts, and in which.

6. DETAILED DESCRIPTION

Figure 1:
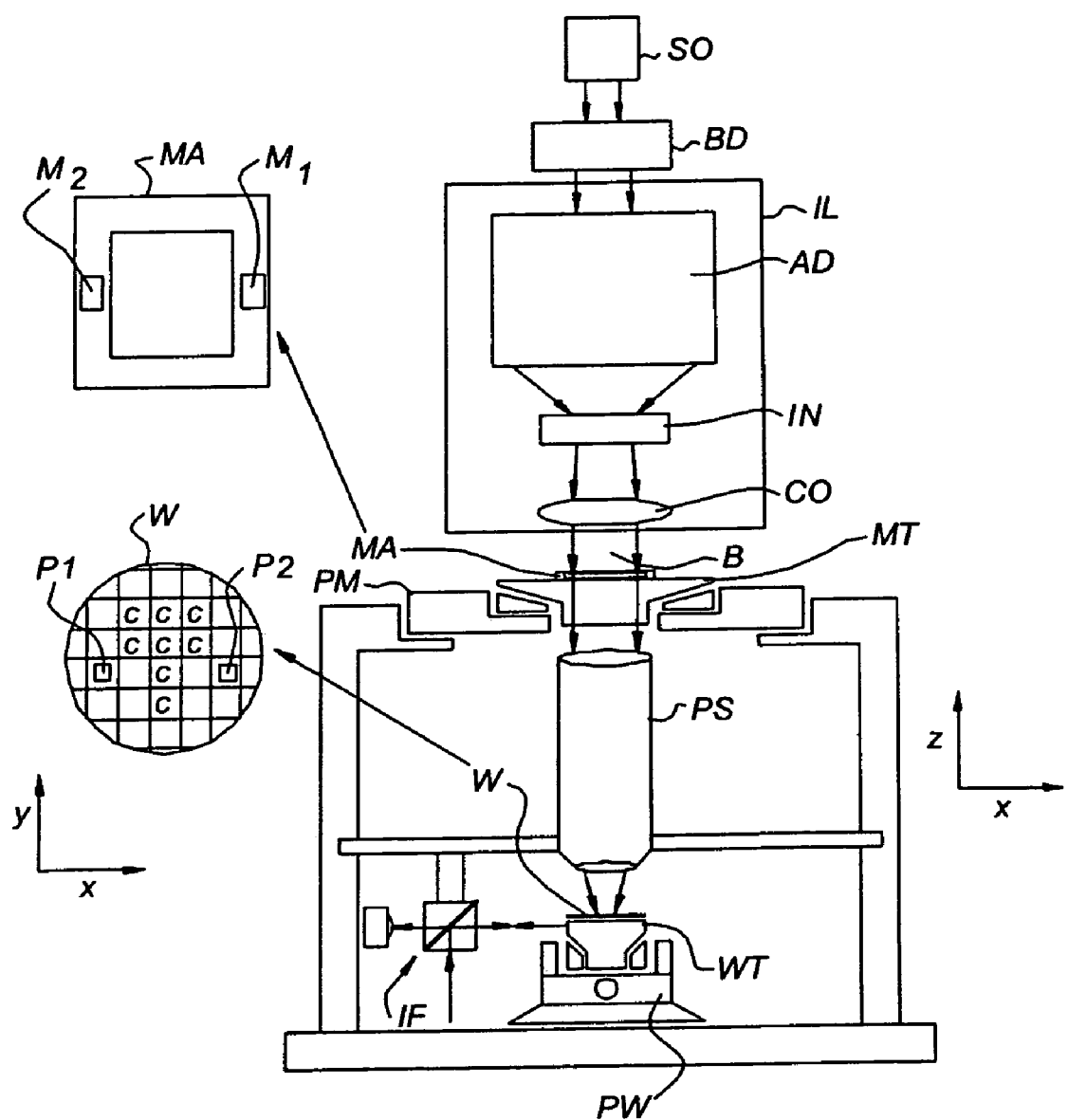
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation), and a support structure (e.g. a mask table) MT constructed to support a patterning device (e.g. a mask) MA and connected to a first positioner PM configured to accurately position the patterning device in accordance with certain parameters. The apparatus also includes a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including for examples suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

Step mode: the mask table MT and the substrate table WT are kept essentially stationary, while an entire pattern imparted to the radiation beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

Scan mode: the mask table MT and the substrate table WT are scanned synchronously while a pattern imparted to the radiation beam is projected onto a target portion C (i.e. a single dynamic exposure); The velocity and direction of the substrate table WT relative to the mask table MT may be determined by the (de-)magnification and image reversal characteristics of the projection system PS. In scan mode, the maximum size of the exposure-field limits the width (in the non-scanning direction) of the target portion in a single dynamic exposure, whereas the length of the scanning motion determines the height (in the scanning direction) of the target portion.

Another mode: the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
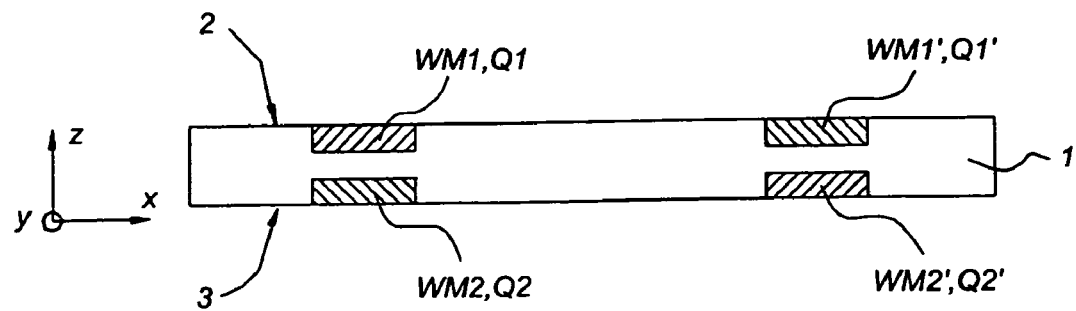
FIG. 2 shows diagrammatically a cross-section of a substrate processed in accordance with an embodiment of the present invention.

FIG. 2 shows diagrammatically a cross-section of a substrate processed in accordance with an embodiment of the present invention.

The substrate 1 shown in FIG. 2 is a first substrate that in a further step will be wafer bonded with a second substrate.

The substrate 1 includes a plurality of first alignment marks WM1, WM1' and a plurality of second alignment marks WM2, WM2'.

According to an embodiment of the present invention, the method for wafer bonding applies the use of first alignment marks WM1, WM1' on the front surface 2 of the substrate 1, i.e., the surface on which devices are created by lithographic processing as known in the art and of second alignment marks WM2, WM2' on the back surface 3 of the substrate 1.

Both first alignment marks WM1, WM1' and second alignment marks WM2, WM2' are created by lithographic processing in the lithographic apparatus as shown in FIG. 1. The lithographic apparatus may be adapted to expose both the front surface 2 and the back surface 3 of the substrate 1, i.e., can take in the substrate with its back surface arranged for lithographic exposure.

The first and second alignment marks WM1, WM1', WM2, WM2' may have lateral positions which coincide with each other within a reasonable accuracy. By using conventional pre-alignment procedures for determining a substrate position on the substrate stage of the lithographic apparatus and based on this pre-alignment creating the alignment marks WM1, WM1', WM2, WM2' it is observed that a difference of a lateral position Q1, Q1' of the first alignment mark WM1, WM1' respectively, and of a lateral position Q2, Q2' of the second alignment mark WM2, WM2' respectively, may correspond with each other within 25 nm or less. Lateral positions Q1, Q1', Q2, Q2' may be expressed in a coordinate system, preferably orthogonal, with a first direction X and a second direction Y.

Alternatively, first and second alignment marks WM1, WM1', WM2, WM2' may be created independently and their lateral positions Q1, Q1', Q2, Q2' may be correlated to each other by using a type of substrate table which is equipped with an internal optical system for measuring the marks on the back side of a substrate. Such a type of substrate table is known from U.S. Pat. No. 6,768,539. Using such a correlation between the lateral positions Q1, Q1', Q2, Q2' the relative difference between an alignment procedure using the first marks WM1, WM1' of the front surface 2 and alternatively, an alignment procedure using the second marks WM2, WM2' of the back surface 3 may be 25 nm or less.

Note that the position Q2 where the second alignment mark WM2 is created, is mirrored with respect to the position Q1 of the first alignment mark WM1, in order to have both marks WM1, WM2 at a substantially same lateral position on the front and back surface respectively (the substrate is flipped over between creating first alignment mark WM1 and second alignment mark WM2).

In practice, this mirror operation may not be needed since a plurality of marks will be created on both surfaces 2, 3 and the arrangement of the alignment marks WM1, WM1', WM2, WM2' on a surface 2, 3 may be such that a mirrored arrangement of the marks WM1, WM1', WM2, WM2' substantially coincides with the arrangement itself.

On each surface 2, 3 of the substrate 1 the first and second alignment marks WM1, WM1'; WM2, WM2' are arranged to have lateral positions Q1, Q1'; Q2, Q2' respectively in such a way that from these lateral positions Q1, Q1'; Q2, Q2' measured on either the front surface 2 or the back surface 3, the substrate orientation is known, i.e., substrate coordinates are determined by which the positions of target portions C (cf. FIG. 1) on the front surface 2 of the substrate 1 are defined and known. Moreover, within each target portion C the location of contact pads is now known.

Figure 3:
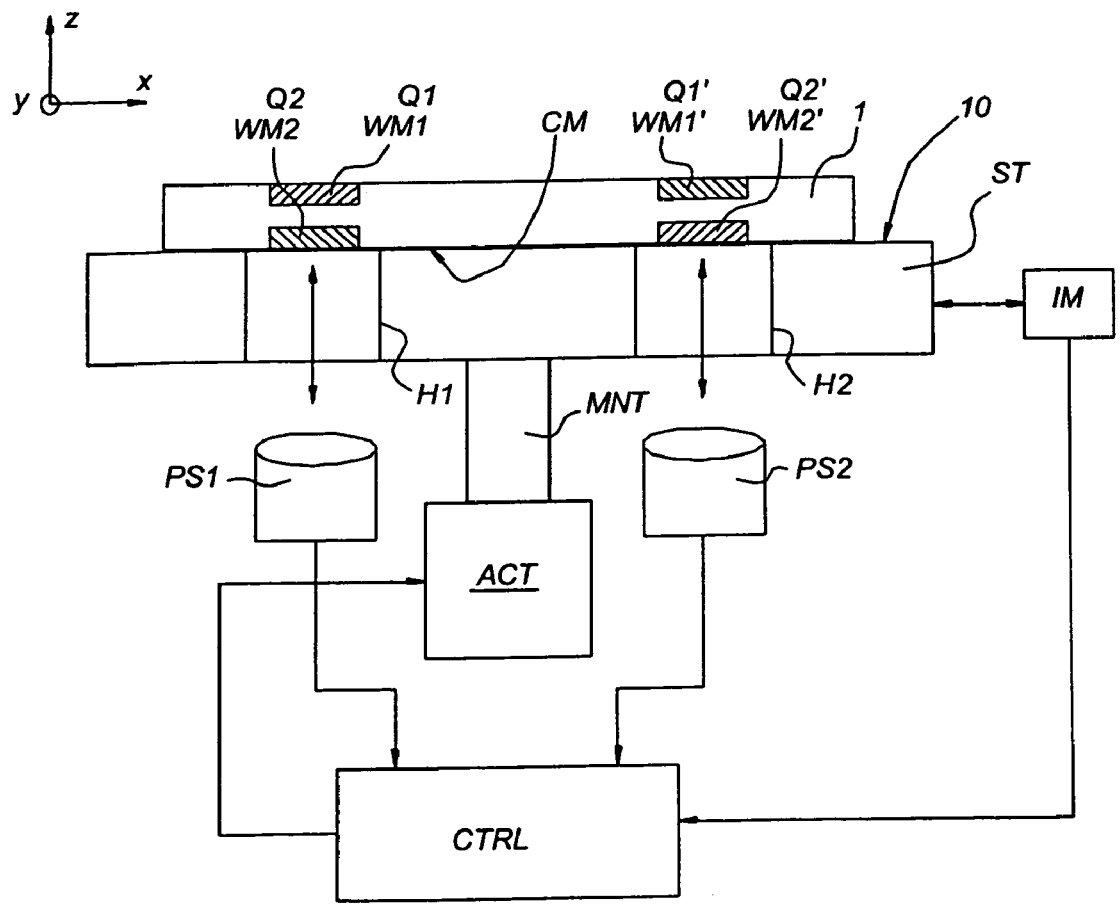
FIG. 3 shows a cross-sectional view of a substrate table in accordance with an embodiment of the present invention.

FIG. 3 shows a cross-sectional view of a substrate table in accordance with an embodiment of the present invention.

The substrate table ST is arranged to receive on a work space surface 10 the substrate 1 as described above with reference to FIG. 2. The substrate table includes the work space surface 10, and inspection holes H1, H2 for passing optical signals, and a clamp CM for clamping a substrate on the work space surface 10. In this way the substrate is positioned at a first reference position. The clamp CM may be a vacuum clamp as will be discussed later in more detail. Other clamp types are possible as well: for example a physical clamp, an electrostatic or a magnetic clamp.

Further, a mount MNT is provided which connects the substrate table ST to an actuator ACT capable of changing a position and orientation of the substrate table ST. The actuator ACT may provide displacement in a horizontal direction X, in a second horizontal direction Y perpendicular to the plane of drawing as well in a vertical direction Z, perpendicular to the X-Y plane. Also, a rotation around the vertical direction Z may be provided by the actuator ACT.

Furthermore, the actuator ACT may be equipped with a tilting device (not shown separately) which enables a surface normal of the substrate table ST to be tilted with respect the Z-direction.

The substrate table ST is further equipped with a sensor IM for determining the position and orientation of the substrate table ST. The sensor IM may be capable of sensing displacement in the three dimensions X, Y, Z, as well as sensing rotation about the vertical direction Z or the horizontal directions X and/or Y. The sensor IM may comprise one or more interferometric devices.

The arrangement also includes position sensors PS1, PS2. The position sensors PS1, PS2 are arranged to sense, in use, through the respective inspection holes H1, H2 positions Q2, Q2' of second alignment marks WM2, WM2'.

Further, the arrangement may include a controller CTRL for controlling the position of the substrate table ST in the three-dimensional (3D) space X, Y, Z.

The position sensor PS1, PS2 is connected to the controller CTRL to output a position signal related to the position of the respective second alignment mark WM2, WM2'.

The actuator ACT is connected to the controller CTRL to receive control signals for displacing the substrate table ST.

The sensor IM is connected to the controller CTRL to output sensing signals related to the position and orientation of the substrate table ST to the controller CTRL.

The controller CTRL uses the sensing signals to determine the control signals to be output to the actuator ACT.

The controller CTRL is capable of determining the position of target portions C on the front surface 2 of the substrate 1 by using the position signal which relates to the positions of second alignment marks WM2, WM2'.

Figure 4:
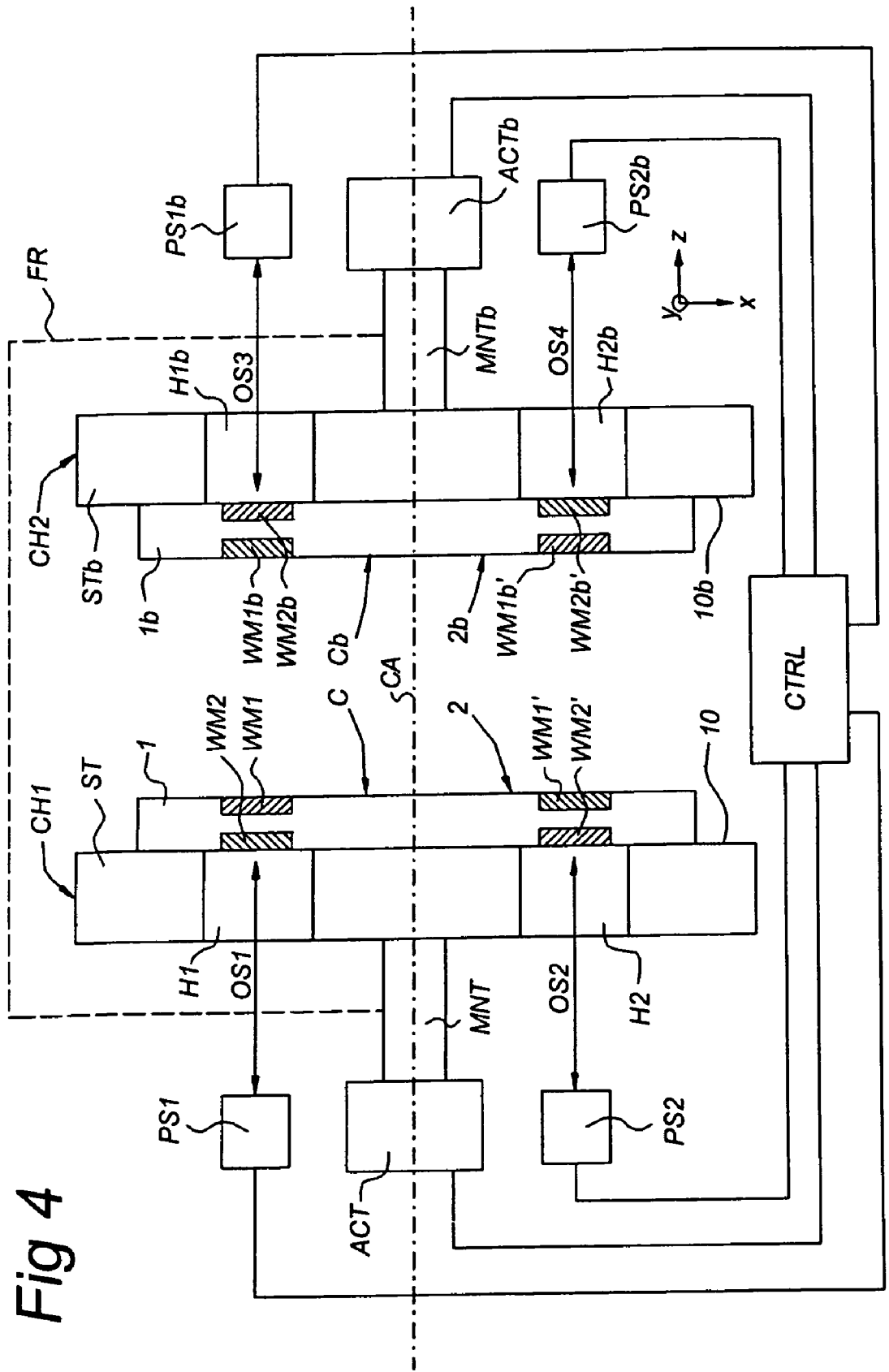
FIG. 4 shows a cross-section of a wafer bonding system according to an embodiment of the present invention.

FIG. 4 shows a cross-section of a wafer bonding system according to an embodiment of the present invention. Such a wafer bonding system will typically be a separate system independent of the lithographic apparatus as described above with reference to FIG. 1.

The wafer bonding system includes a first chuck CH1 and a second chuck CH2. The first chuck CH1 corresponds to the first substrate table ST similar to the substrate table ST, as discussed with reference to FIG. 3. The second chuck CH2 corresponds to a second substrate table STb which is substantially similar to the first substrate table ST.

The second substrate table STb includes a second work space surface 10b, and second inspection holes H1b, H2b for passing optical signals, and a second clamp CMb for clamping a second substrate on the second work space surface 10b. By clamping, the second substrate is positioned at a second reference position. The second clamp CMb may be a vacuum clamp as will be discussed later in more detail. Other clamp types are possible as well: for example a physical clamp, an electrostatic or a magnetic clamp.

The second substrate table STb is arranged to receive on a second work space surface 10b a second substrate 1b as described above with reference to FIG. 2.

Further, a second mount MNTb is provided which connects the second substrate table STb to a second actuator ACTb capable of changing a position and orientation of the second substrate table STb. The second actuator ACTb may provide displacement in the horizontal direction X, in the second horizontal direction Y perpendicular to the plane of drawing as well in the vertical direction Z. Also, a rotation around the vertical direction Z may be provided by the second actuator ACTb. If needed, the second actuator ACTb may be equipped with a tilting device (not shown) for tilting the surface normal of the second substrate table STb, with respect to the direction indicated by line CA.

The second substrate table STb is further equipped with a second sensor IMb for determining the position and orientation of the second substrate table STb. The second sensor IMb may be capable of sensing displacement in the three dimensions X, Y, Z, as well as sensing rotation (and, if needed, tilt) about the vertical direction Z or the horizontal directions X and/or Y. The second sensor IMb may include one or more interferometric devices.

The second substrate table STb also includes second position sensors PS1b, PS2b. The second position sensors PS1b, PS2b are arranged to sense, in use, through the respective second inspection holes H1b, H2b second positions Q2b, Q2b' of second alignment marks WM2b, WM2b'.

Both first and second chuck CH1, CH2 may be connected to, preferably, one controller CTRL. The one controller CTRL is arranged to receive signals from both the position sensors PS1, PS2 of the first substrate table ST and the second position sensors PS1b, PS2b of the second substrate table STb.

Instead of one controller CTRL for controlling the arrangement of the first and second chucks CH1, CH2, it is conceivable that each chuck CH1; CH2 is controlled by a separate controller CTRL; CTRLb and that both separate controllers CTRL; CTRLb exchange signals for control within the arrangement of the first and second chucks CH1, CH2. This will be described later in more detail.

First chuck CH1 and second chuck CH2 are arranged in a way that the work space surface 10 of first chuck CH1 faces the second work space surface 10b of the second chuck CH2. The first and second chuck CH1, CH2 are therefore each mounted on a frame FR. Both chucks CH1, CH2 are aligned relative to each other along a central rotational axis CA, which is indicated as a dotted line. The central axis CA is parallel to the vertical displacement direction Z as indicated in FIG. 3.

In use, a first substrate 1 is clamped on the work space surface 10 of the first chuck CH1. On the first substrate 1 target portions C (manufactured by lithographic processing) are present (cf. FIG. 1). A second substrate 1b is clamped on the second work space 10b of the second chuck CH2. On the second substrate 1b target portions Cb (manufactured by lithographic processing) are present.

First and second optical signals OS1, OS2 generated on the back surface alignment marks WM2, WM2' respectively, are measured by the position sensors PS1, PS2 respectively on first chuck CH1. The back surface alignment marks WM2, WM2' are illuminated by an illumination beam (e.g. a laser beam) through the respective inspection holes H1, H2. Also, the first and second optical signal OS1, OS2 generated on the respective alignment mark WM2, WM2' is transmitted through the corresponding inspection hole H1, H2 to the position sensor PS1, PS2 for that back surface alignment mark WM2, WM2' of the first substrate 1.

The position and orientation of the first substrate 1 is determined from the first and/or second optical signals OS1, OS2 by the controller CTRL. The position and orientation of the first substrate 1 relate to the lateral positions Q2, Q2' which are derived from measurements on the back surface alignment marks WM2, WM2' of the first substrate 1, as described above. From the substrate position and orientation of first substrate 1 the positions of the target portions C on the front surface 2 of the first substrate 1 are determined.

Third and fourth optical signals OS3, OS4 generated on the back surface alignment marks WM2b, WM2b' respectively, of the second substrate 1b are measured by the second position sensors PS1b, PS2b on the second chuck CH2. The back surface alignment marks WM2b, WM2b' are illuminated by an illumination beam (e.g. a laser beam) through the respective second inspection holes H1b, H2b. Also, the third and fourth optical signals OS3, OS4 generated on the respective alignment marks WM2b, WM2b' are transmitted through the corresponding inspection hole H1b, H2b to the second position sensor PS1b, PS2b for that back surface alignment mark WM2b, WM2b' of the second substrate 1b.

The position and orientation of the second substrate 1b is determined from the third and/or fourth optical signals OS3, OS4 by the controller CTRL. The position and orientation of the second substrate 1b relate to the lateral positions Q2b, Q2b' which are derived from measurements on the back surface alignment marks WM2b, WM2b' of the second substrate 1b, as described above.

From the substrate position and orientation of second substrate 1b the positions of the target portions Cb on the front surface 2b of the second substrate 1b are determined.

Next, the substrate orientation of first substrate 1 is matched up with the substrate orientation of second substrate 1b, possibly by taking into account the positions of target portions C on the first substrate 1 and the positions of the target portions Cb on the second substrate 1b to obtain a match of first and second devices in the chip to be formed.

Since both the first chuck CH1 and the second chuck CH2 are arranged with a common reference position in the x-y plane (perpendicular to the plane of drawing), a displacement and/or a rotation in that x-y plane of the first substrate 1 relative to the second substrate 1b may be carried out for matching the substrate orientations of the first and second substrate 1, 1b.

The displacement and/or rotation in the x-y plane (of the first substrate 1 relative to the second substrate 1b) is controlled by the controller CTRL which transmits controlling signals to at least one of the actuators ACT, ACTb to obtain a substantially coincident orientation of the first and second substrates to create functional contact, i.e., the location of first contact pads on target portion C of the first substrate 1 are aligned with the location of further contact pads on second target portion Cb of the second substrate 1b, the further contact pads facing the first contact pads.

As known to persons skilled in the art, the common reference position can be provided by the frame FR on which both chucks CH1, CH2 are mounted. The sensor IM of the first chuck CH1 and the sensor IMb of the second chuck CH2 can determine the position of the first chuck CH1 and second chuck CH2 respectively, relative to the common reference position. Further, both first and second substrate are positioned at the first and second reference positions, respectively, which positions are also known. Therefore, it is also possible to align the substrate orientation of the first substrate 1 to the substrate orientation of the second substrate 1b.

The controller CTRL receives the signals of the sensors IM, IMb as feedback signal related to the reference position.

Then, the first and second substrates 1, 1b are brought in close contact by displacing first chuck CH1 and second chuck CH2 relative to each other parallel to the central axis CA. Because of the application of precision drive mechanics in the actuators ACT, ACTb the first and second substrates 1, 1b can be brought in contact while using the sensors IM, IMb on the first and second chuck CH1, CH2 respectively to monitor the respective orientation of first and second substrates. The controller CTRL of the first chuck CH1 and/or the controller CTRLb of the second chuck CH2 may be arranged for adjusting the respective substrate orientation in order to maintain the alignment between the first and second substrates 1, 1b. In an embodiment of the invention, the controller(s) CTRL and/or CTRLb provide(s) a continuous correction capability of the positions of the first and second substrate relative to each other by adjusting the orientation of substrate table ST, STb as given by the X, Y, Z, rotation angle and tilt parameters.

It is further noted that the wafer bonding system according to an embodiment of the present invention may be arranged in such a way that both the first and the second chuck CH1, CH2 each include an actuator ACT, ACTb for their relative motion with respect to each other. Alternatively, the wafer bonding system may be arranged in such a way that only one of the first and second chucks CH1, CH2 is arranged with an actuator ACT while the other of the first and second chucks CH1, CH2 is in a fixed position in, or relative to, the reference frame FR.

Further, the tilting device within the actuator ACT; ACTb may be used to compensate a possible wedge error of one or both of the first and second substrates.

In the wafer bonding system one of the substrate tables ST, STb of the chucks CH1, CH2 may be designed to have a convex surface with preferably an apex substantially coinciding with the center of that substrate table. The convexity may be about 10 to 50 microns. Furthermore, the substrate table may be arranged as a two-piece substrate table, having an inner portion and a surrounding outer portion. In such a two-piece substrate table the inner portion is moveable, compared to the outer portion, in the direction of the surface normal so as to change a height of the surface of the inner portion in relation to the surface level of the outer portion. In this way the convexity of the substrate table can be settable. A skilled person will appreciate that the actuation of the inner portion may be (electro-) mechanical, and/or pneumatic.

The other substrate table may be substantially flat. Due to the convexity of one of the substrate tables, the substrate that is clamped on that convex substrate table will exhibit a curvature substantially along the convex surface of the substrate table. The other substrate which is on the other flat substrate table may be flat.

When being bonded, the first and second substrates will make first contact at substantially the location of the center of the convex substrate table (i.e., at the apex of the convex surface). In this manner, the gas outflow from between the substrates (one convex, the other flat) will be improved and reduce the typical "slip error" that would occur between two flat surfaces that may float relative to each other during the outflow of gas. Once contact is made at the center of the substrate table then the clamp on the bonding chuck may begin to release allowing the two substrates to complete bonding, advantageously without entrapment of gas during the bonding process. Conventionally, bonding of flat substrates is known to result in a possible creation of local pockets or bubbles in the final bond between the first device and the second device. Such pockets or bubbles would obviously prevent the formation of a useful contact between the first and second devices.

Figure 5:
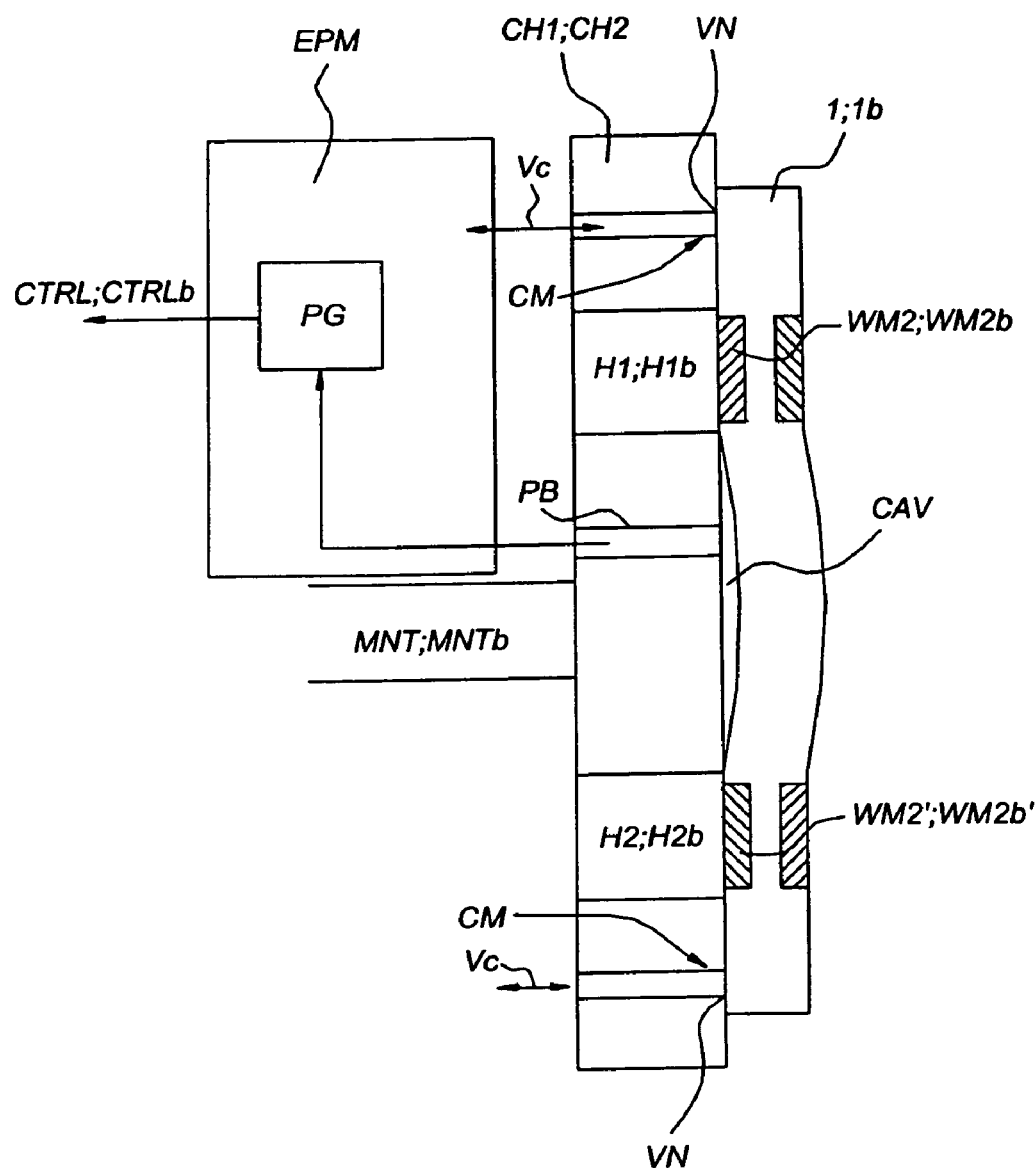
FIG. 5 shows a cross-section of a substrate table according to an embodiment of the present invention.

FIG. 5 shows a cross-section of a substrate table according to one embodiment of the present invention.

For determining an end-point at which the first and second substrates 1, 1b to be bonded, the first and second substrate table ST, STb is each arranged with an end-point detection EPM (or end-point detection device) which is capable to detect a point of full contact between the first and second substrates 1, 1b.

In this embodiment the clamp CM includes a vacuum holder with nozzles VN to grip the substrate's back surface near its edge. By applying a vacuum VC at the nozzles VN the substrate 1; 1b is clamped on the substrate table of the chuck CH1; CH2.

The end-point detection EPM (or end-point detection device) includes in one embodiment a pressure gauge PG linked through a bore hole PB to a cavity CAV in between the substrate 1, 1b and the substrate table ST, STb on which the substrate is mounted. The cavity CAV is generated by a applying a gas pressure below the substrate through the bore hole PB.

In use, the pressure gauge PG is capable of measuring the change of pressure due to a change of the size of the cavity CAV (i.e., measuring a 'back-pressure'), when the first and second substrates 1, 1b are brought into contact with each other. Typically, the pressure as measured will be (and remain) constant when the substrates 1, 1b are in full contact. The pressure gauge PG of a chuck CH1; CH2 is connected to the respective controller CTRL; CTRLb of that chuck CH1; CH2 for providing a signal to the controller when the end-point is detected as described above. The controller CTRL; CTRLb is arranged to stop the motion of the chuck CH1; CH2 to approach the other chuck CH2; CH1 when the pressure signal indicates the end-point. Possibly, the chuck CH1; CH2 communicates the control signal related to the pressure gauge PG to the controller CTRL; CTRLb of the other chuck CH1; CH2.

Note that the end-point detection or end-point detection device as described in relation to FIG. 5 may be done on one chuck CH1; CH2 or on two chucks CH1, CH2, in dependence on the wafer bonding system design.

Note also that alternatively the end-point detection could involve the use of more than one cavity, which are each linked to a pressure gauge. Furthermore, the pressure gauge in that case could arranged to measure a differential pressure between the cavities.

As will be appreciated by a person skilled in the art, the end-point detection as described above can be combined with either a substrate table with a flat surface or a substrate table with a convex surface.

Figure 6:
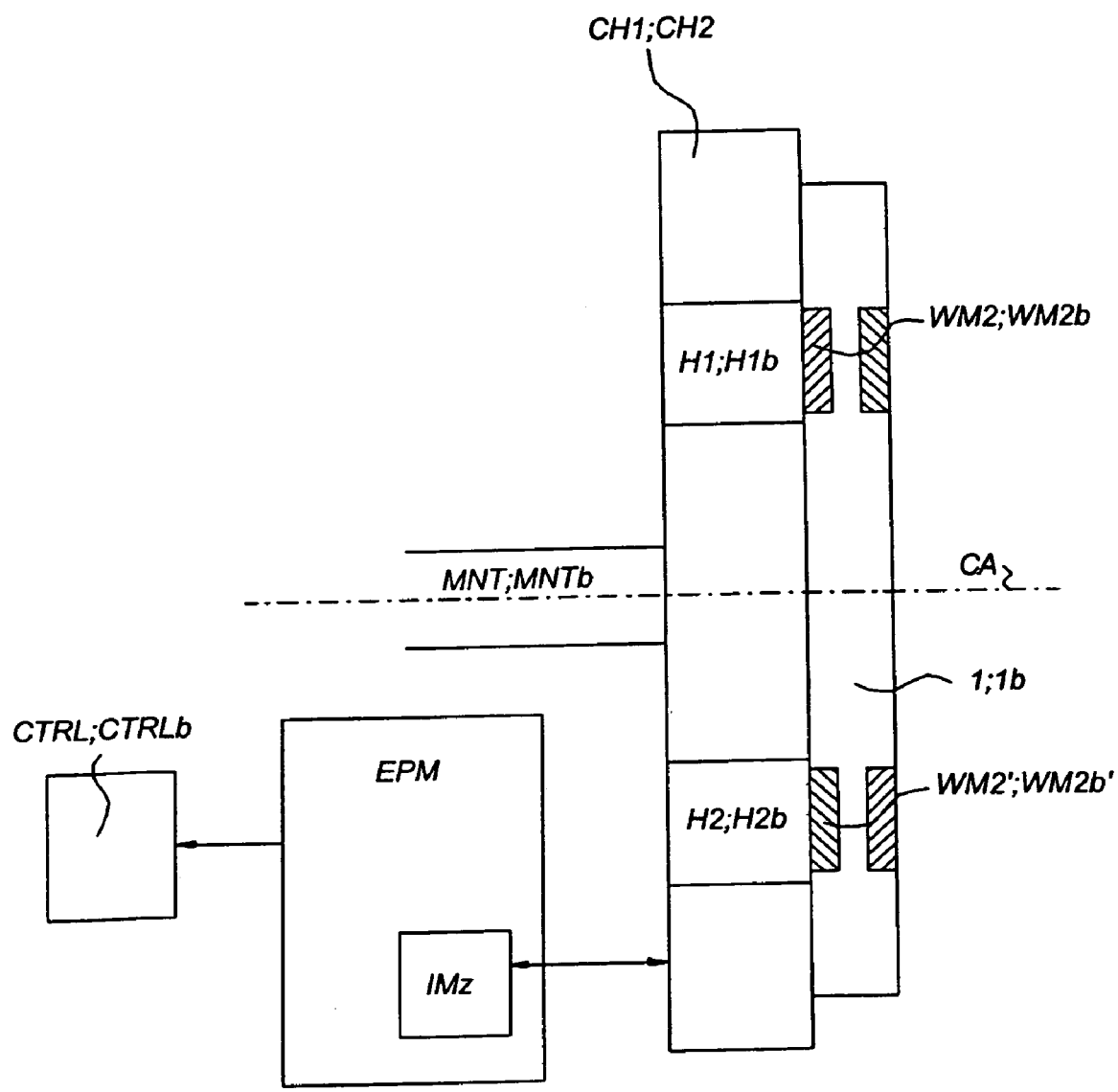
FIG. 6 shows a cross-section of a substrate table according to another embodiment of the present invention.

FIG. 6 shows a cross-section of a substrate table according to another embodiment of the present invention.

The end-point detection EPM can include a laser interferometer IMz. End point detection is measured with the aid of laser interferometry which measures a motion of a substrate table along the central axis CA (in the z-direction). When carrying a movement operation of the chucks CH1, CH2 relative to each other, the interferometer IMz detects that motion has stopped, a detection signal is passed to the controller CTRL; CTRLb to indicate that the end-point is reached. The controller CTRL; CTRLb may then stop the motion of the substrate table ST; STb at that point.

Optical end-point detection EPM can be used advantageously in case of a wafer bonding system which is arranged for operation in vacuum.

Note that the end-point detection as described in relation to FIG. 6 may be done on one movable chuck CH1; CH2 or if both chucks CH1, CH2 are movable, possibly on each of the two movable chucks CH1, CH2, in dependence on the wafer bonding system design.

Figure 7:
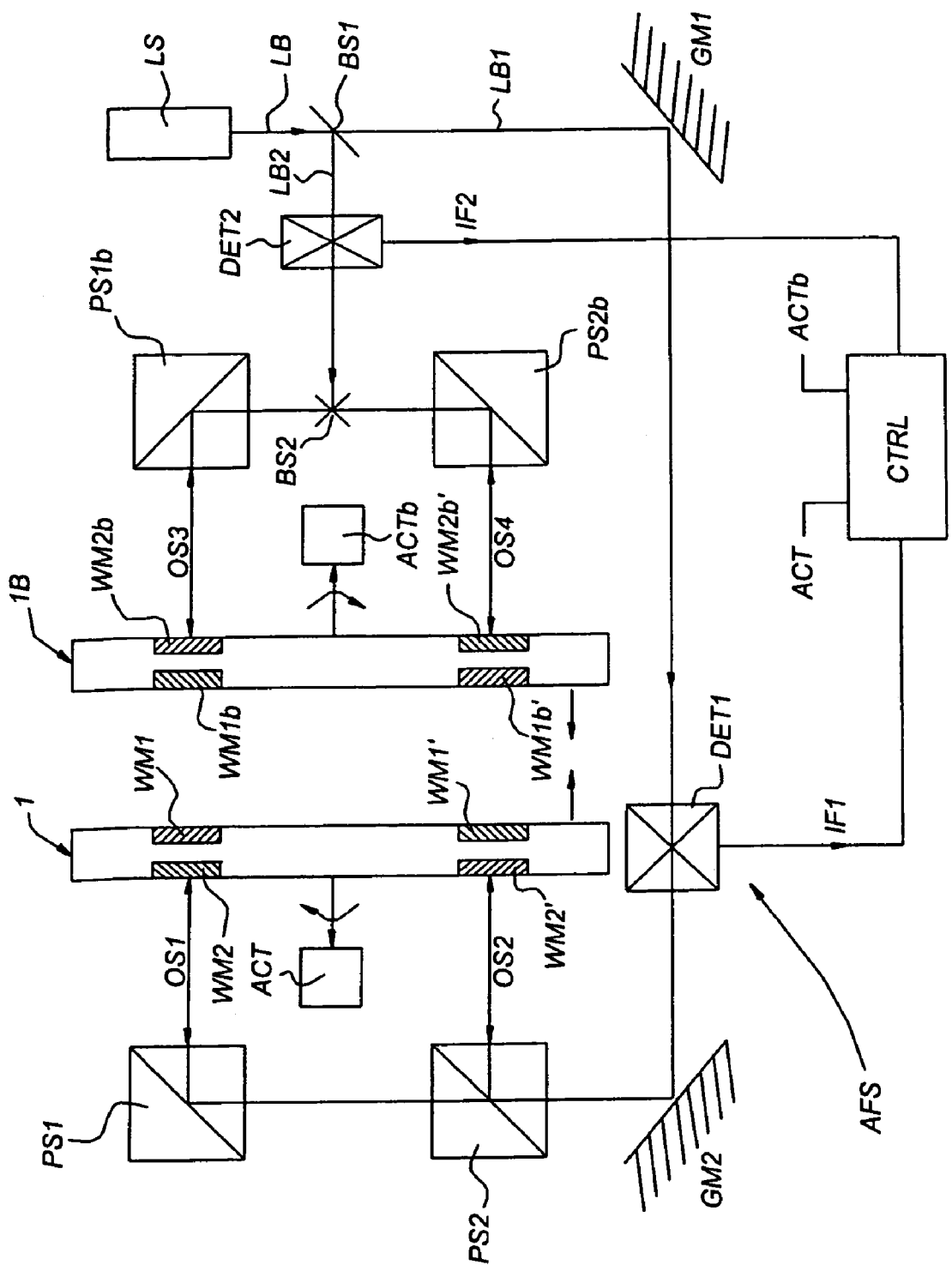
FIG. 7 shows diagrammatically an alignment feedback system for use in a wafer bonding system according to an embodiment of the present invention.

FIG. 7 shows diagrammatically an alignment feedback system AFS for use in a wafer bonding system according to an embodiment of the present invention.

In FIG. 7 entities with a reference as shown in a preceding figure relate to the same entities as shown in that preceding figure.

In this exemplary embodiment, the alignment feedback system AFS for use in a wafer bonding system includes a laser source LS for generating a laser beam, optical components BS1, BS2 for splitting the laser beam, position sensors PS1, PS2, PS1b, PS2b, guiding mirrors GM1, GM2, and detectors DET1, DET2.

For clarity of the drawing, the substrate tables ST, STb of the first and second chucks CH1, CH2 have been omitted, only the first and second substrates 1, 1b are shown in their positions.

The laser source LS generates a laser beam LB which is split at first beam splitter BS1 split in first and second laser beams LB1 and LB2. First laser beam LB1 is directed along guiding mirrors WM1, WM2 to the position sensors PS1, PS2 of the first chuck CH1. The first laser beam LB1 is split in a first beam portion for the first position sensor PS1 and a second beam portion for the second position sensor PS2 of the first chuck CH1. In the optical path of the first laser beam LB1 a first detector DET1 is located.

Second laser beam LB2 is directed along a beam splitter BS2 to the position sensors PS1b, and PS2b of the second chuck CH2. The second laser beam LB2 is split in a third beam portion for the first position sensor PS1b of the second chuck CH2 and a fourth beam portion for the second position sensor PS2b of the second chuck CH2. In the optical path of the second laser beam LB2 a second detector DET2 is located.

Both first and second detectors are interferometer-type detectors.

In use, on first back surface alignment marker WM2 of the first substrate 1 a first optical signal OS1 is generated and on second back surface alignment marker WM2' of the first substrate 1 a second optical signal OS2 is generated. On first back surface alignment marker WM2b of the second substrate 1b a third optical signal OS3 is generated and on second back surface alignment marker WM2b' of the second substrate 1b a fourth optical signal OS4 is generated.

In use, the first marker WM2 on the back surface 3 of the first substrate 1 is illuminated by the first beam portion of the first laser beam LB1. The marker WM2 diffracts the light from the first beam portion: (a portion of) the diffracted light is transmitted as the first optical signal OS1 in the direction of the first detector DET1 along substantially the same path of the first beam portion. The second marker WM2' on the back surface 3 of the first substrate 1 is illuminated by the second beam portion of the first laser beam LB1. The marker WM2' diffracts the light from the second beam portion: (a portion of) the diffracted light is transmitted as the second optical signal OS2 in the direction of the first detector DET1 along substantially the same path of the second beam portion. The first detector DET1 measures a first interference signal IF1 relating to interference of the diffracted light beams OS1, OS2 as diffracted on the first and second marker WM2, WM2' of the back surface 3 of the first substrate 1 and of the first laser beam LB1 incoming from the laser source LS. The first interference signal IF1 is transmitted to the controller CTRL.

Similarly, signals relating to the back surface markers WM2$b$, WM2$b'$ of the second substrate 1$b$ are detected. The first marker WM2$b$ on the back surface of the second substrate 1$b$ is illuminated by the third beam portion of the second laser beam LB2. The marker WM2$b$ diffracts the light from the third beam portion: (a portion of) the diffracted light is transmitted as the third optical signal OS3 in the direction of the second detector DET2 along substantially the same path of the third beam portion. The second marker WM2$b'$ on the back surface of the second substrate 1$b$ is illuminated by the fourth beam portion of the second laser beam LB2. The marker WM2$b'$ diffracts the light from the fourth beam portion: (a portion of) the diffracted light is transmitted as the fourth optical signal OS4 in the direction of the second detector DET2 along substantially the same path of the fourth beam portion. The second detector DET2 measures a second interference signal IF2 relating to interference of the diffracted light beams OS3, OS4 as diffracted on the first and second marker WM2$b$, WM2$b'$ of the back surface of the second substrate 1$b$ and of the second laser beam LB2 incoming from the laser source LS. The second interference signal IF2 is transmitted to the controller CTRL.

Both interference signals IF1, IF2 of the first detector DET1 and of the second detector DET2 respectively are each transmitted to the controller CTRL. The controller CTRL uses the interference signal IF1; IF2 of the corresponding detector DET1; DET2 to adjust the position of the substrate 1; 1$b$ as respectively measured by the detector in such a way that a sufficient alignment and overlap of the first and second substrates 1; 1$b$ relative to each other (i.e., a coincidence in their respective lateral positions Q2, Q2', Q2$b$, Q2$b'$ within the device area) in such a way that the electronic circuit formed from the devices will be actually functional is achieved.

It is noted that the controller CTRL; CTRLb may be a computer system arranged for controlling the respective chuck CH1; CH2. Also, the controller CTRL; CTRLb may be a programmable logic controller (PLC) or a dedicated process controller.

The controller CTRL; CTRLb is arranged for input of signals relating to the position of markers WM2, WM2'; WM2$b$, WM2$b'$ on a substrate 1; 1$b$, and for signals relating to end-point detection. Also, the controller CTRL; CTRLb is arranged with some reference signal for determining a reference position relative to some coordinate system (for example, reference frame FR) for the respective chuck CH1; CH2.

Next, the controller CTRL; CTRLb is arranged for adapting a position of a first and second substrate 1; 1$b$ by computation based on the aforementioned input signals. Furthermore, the controller CTRL; CTRLb is arranged for relatively moving the first substrate 1 in a direction towards the second substrate 1$b$ by computation based on the aforementioned input signals. Preferably, in case of separate controllers CTRL, CTRLb the controller CTRL; CTRLb of one of the chucks CH1; CH2 which holds one of the first and second substrates 1; 1$b$, is arranged for receiving information on the position of the other of the first and second substrates 1; 1$b$ from the controller CTRL; CTRLb of that other chuck CH1; CH2, which information can be used in computations relating to the relative position and/or displacement of the first and second substrates 1; 1$b$.

It is noted that the wafer bonding system according to the invention can be used for any wafer bonding method known in the art, such as anodic, thermal or adhesive bonding.

It will be appreciated that the present invention is not only suitable for so-called face-to-face bonding, but also for face-to-back bonding and back-to-back bonding. Face-to-face bonding refers to a situation where the surfaces that are bonded both comprise device structures (manufactured, e.g., through lithography). Face-to-back bonding refers to situations where only one of the surfaces that are bonded comprises device structures, and back-to-back bonding refers to situations where none of the surfaces that are bonded comprise device structures.

In face-to-back or back-to-back bonding, it may not be necessary to provide alignment marks on both sides of the substrate. Assume, for instance, that the substrates to be bonded both comprise a surface having device structures (the "front surface" or "face") and a "back surface" that does not comprise device structures, whereby the front surface already comprises alignment marks that were provided during the device manufacturing. In face-to-back bonding, it may not be necessary to provide additional alignment marks on the back surface of the substrate that has its front surface, which already comprises alignment markers, facing the substrate table. In back-to-back bonding, both substrates have their front surface (with alignment marks already provided) facing the substrate table and none of the substrates may therefore require alignment marks on the back surface.

Even in face-to-face bonding, it may not be necessary to provide additional alignment marks, for instance if the devices on the front surface of the substrate were manufactured while using alignment marks on the backside of the substrate. See, e.g., U.S. Pat. No. 6,768,539 for lithography processes using backside markers.

In one embodiment, at least one of the substrates is aligned relative to the other substrate while at least one of the substrates faces the other substrate. A suitable arrangement for such a procedure is, for instance, the arrangement shown in FIG. 4.

Another way of aligning substrates is by starting with the substrates facing each other at a known position, moving a first substrate out of the known position to a measuring position to determine the orientation of the first substrate, and then moving the first substrate back to its known position. The second substrate is then moved to the measuring position, its orientation is determined and then adjusted relative to the measured orientation of the first substrate. The second substrate is subsequently moved back to its known position and the substrates are bonded. See, e.g., U.S. Pat. No. 6,214,692. Alternatively, the first substrate is moved from a holding station to a known position in a measuring station, its orientation is determined and subsequently the first substrate is moved back to the holding station. Then, the second substrate is moved to a known position in the measuring station, the known position of the second substrate being such that if the first substrate were present in the known position of the first substrate, the first and second substrate would face each other. The orientation of the second substrate is determined and adjusted relative to the measured orientation of the first substrate. Then, the first wafer is moved from the holding station back to its known position in the measuring station and the substrates are bonded.

Although conventional methods such as disclosed in U.S. Pat. No. 6,214,692 may not need additional alignment marks in face-to-face bonding, a disadvantage of the conventional methods is that they typically employ opposing microscopes or opposing alignment sensors, and that alignment accuracy of the substrates therefore not only depends on the accuracy of the stages for moving the substrates, but also on the positioning accuracy of the opposing microscopes (or alignment sensors), which tends to be relatively poor.

Figure 8:
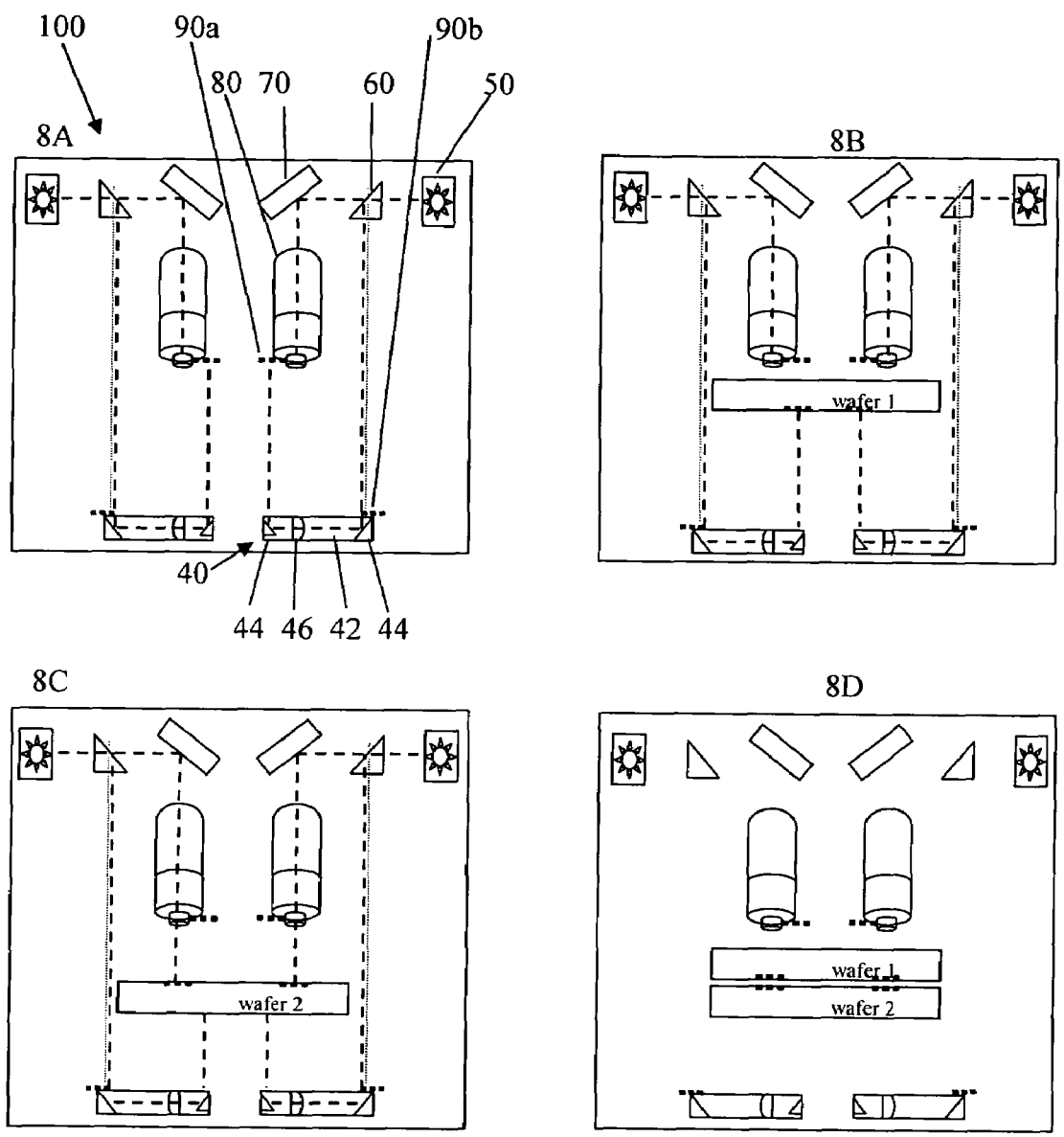
FIG. 8 shows a wafer bonding system according to an embodiment of the present invention.

In one embodiment, the present invention provides an alignment system for wafer bonding that employs opposing sets of alignment optics, wherein at least one set includes a folding mirror system. See FIG. 8A-D. The wafer bonding system 100 includes two alignment systems that each comprise an optical system 80 provided with a reference plate 90a that comprises one or more phase grating marks, a mirror element 70, a beamsplitter 60, and an alignment sensor 50. In one embodiment, the optical system 80 comprises a microscope. In an embodiment, the optical system 80 is absent a microscope. Furthermore, each of the alignment systems comprises a mirror system 40. In an embodiment, each mirror system 40 comprises an optical arm 42 including at least two folding mirrors 44. In an embodiment, the optical arm further includes one or more, e.g. at least two, lenses 46. The mirror system 40 may be a magnifying system. For more information about mirror systems comprising folding mirrors, see U.S. Pat. No. 6,768,539 and U.S. application Ser. No. 10/998,180 (filed 29 Nov. 2004), which are both hereby incorporated in their entirety by reference. The mirror systems 40 are each provided with a reference plate 90b that comprises one or more phase grating alignment marks. In an embodiment, the reference plate 90b is a transparent reference plate. In an embodiment, the reference plate 90b is a reflecting reference plate. In FIG. 8A, the alignment system is calibrated by determining the alignment of mirror systems 40 relative to optical systems 80 using the marks provided by 90a and 90b. In an embodiment, mirror system 40 is provided on a movable stage to facilitate alignment. Using phase grating alignment for the calibration aids in reducing the reliance of the alignment accuracy of the wafer bonding system 100 on the positioning of optics systems 80 relative to mirror systems 40. Having determined the positioning of mirror systems 40 relative to optical systems 80, the first substrate (e.g. wafer) is moved from a holding station to a known position in wafer bonding system 100. Using the (phase grating) alignment marks on the first substrate, the mirror systems 40, in conjunction with beam splitters 60 and alignment sensors 50, determine the orientation of the first substrate. The first substrate is then moved back to a holding system and the second substrate is moved to a known position in the wafer bonding system 100. Using the (phase grating) marks on the second substrate, the orientation of the second substrate is determined with optics system 80, in conjunction with mirrors 70 and alignment sensors 50, and the orientation of the second substrate is corrected relative to the orientation determined for the first substrate. Referring to FIG. 8D, the first substrate is moved back to the known position in the wafer bonding system 100 and the first and second substrate are bonded.

Although specific reference may be made in this text to the use of a wafer bonding system in the manufacture of ICs, it should be understood that the wafer bonding system apparatus described herein may have other applications, such as the manufacture of integrated optical systems, guidance and detection patterns for magnetic domain memories, flat-panel displays, liquid-crystal displays (LCD's), thin film magnetic heads, etc. The person skilled in the art will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

We claim:

1. A substrate bonding system comprising:
   an alignment system including:
      one or more first optical systems, and
      one or more second optical systems opposing the one or more first optical systems, at least one of said one or more second optical systems including at least two folding mirrors,
   a first substrate table, said first substrate table being arranged to move into and out of a space defined between the opposing optical systems, and
   a second substrate table, said second substrate table being arranged to move into and out of a space defined between the opposing optical systems,
   wherein, in use, the alignment system is used for altering the position of one or both of the first substrate table and the second substrate table for bonding a first substrate and a second substrate.

2. The substrate bonding system of claim 1, wherein said alignment system further includes one or more alignment sensors, said alignment sensors being coupled both to one or more of said first optical systems and to one or more of said second optical systems.

3. The substrate bonding system of claim 1, wherein said alignment system is constructed to determine alignment based on phase grating alignment marks.

4. The substrate bonding system of claim 1, wherein said at least one of said one or more second optical systems further comprises at least two lenses.

5. The substrate bonding system of claim 1, wherein at least one of said one or more first optical systems includes a microscope.

6. The substrate bonding system of claim 1, wherein at least one of said one or more first optical systems comprises at least one alignment mark.

7. The substrate bonding system of claim 6, wherein said at least one alignment mark is a phase grating alignment mark.

8. The substrate bonding system of claim 1, wherein said at least one of said one or more second optical systems comprises at least one alignment mark.

9. The substrate bonding system of claim 8, wherein said at least one alignment mark is a phase grating alignment mark.

10. The substrate bonding system of claim 1, wherein said at least one of said one or more second optical systems is positioned on a movable stage.

11. A substrate bonding system of claims 1, wherein the alignment system is absent opposing microscopes or opposing alignment sensors for viewing surfaces of the first and second substrates opposite bonding surfaces thereof.

* * * * *